United States Patent
Kim et al.

(10) Patent No.: US 8,643,059 B2
(45) Date of Patent: Feb. 4, 2014

(54) SUBSTRATE STRUCTURE AND METHOD OF MANUFACTURING THE SAME

(75) Inventors: Jun-youn Kim, Hwaseong-si (KR); Su-hee Chae, Suwon-si (KR); Hyun-gi Hong, Suwon-si (KR); Young-jo Tak, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 96 days.

(21) Appl. No.: 12/983,414

(22) Filed: Jan. 3, 2011

(65) Prior Publication Data

US 2012/0007143 A1      Jan. 12, 2012

(30) Foreign Application Priority Data

Jul. 6, 2010  (KR) .......................... 10-2010-0064872

(51) Int. Cl.
*H01L 21/02*          (2006.01)

(52) U.S. Cl.
USPC ................. 257/190; 257/13; 257/84; 257/85; 257/94; 257/E33.005; 257/E33.006; 257/E33.024; 257/E33.025; 257/E33.026; 438/739; 438/740

(58) Field of Classification Search
USPC ................. 257/190, 200, E21.121, E33.005, 257/E33.006, E33.024–E33.026, 13, 84, 257/85, 94; 438/739, 740
See application file for complete search history.

(56) References Cited

U.S. PATENT DOCUMENTS 7,435,666 B2 * 10/2008 Park ............................... 438/479
7,781,242 B1 *  8/2010 Chen et al. ...................... 438/29
2006/0223330 A1 * 10/2006 Fudeta et al. ................. 438/752
2008/0128716 A1 *  6/2008 Tazima et al. .................. 257/88
2009/0239361 A1 *  9/2009 Igari et al. ..................... 438/507

FOREIGN PATENT DOCUMENTS

KR      1020110018105 A      2/2011
KR      1020110021406 A      3/2011

OTHER PUBLICATIONS

S. Tripathy et al., "InGaN/GaN light emitting diodes on nanoscale silicon on insulator" Applied Physics Letters 91, 231109, 2007, whole document.
M. Jamil et al., "Development of strain reduced GaN on Si (111) by substrate engineering" Applied Physics Letters 87, 082103, 2005, whole document.
J. Cao et al., "Improved quality GaN by growth on compliant silicon-on-insulator substrates using metalorganic chemical vapor deposition" Journal of Applied Physics, vol. 83, No. 7, Apr. 1, 1998, pp. 3829-3834.
R. Armitage, et al., "Lattice-matched HfN buffer layers for epitaxy of GaN on Si," *Applied Physics Letters*, vol. 81, No. 8, pp. 1450-1452 (Aug. 19, 2002).
N.C. Chen, et al., "Nitride light-emitting diodes grown on Si (111) using a TiN template," *Applied Physics Letters*, vol. 88, pp. 191110-1-191110-3 (2006).
M.H. Oliver, et al., "Organometallic vapor phase epitaxial grown of GaN on ZrN/AlN/Si substrates," *Applied Physics Letters*, vol. 93, pp. 023109-1-023109-3 (2008).

* cited by examiner

*Primary Examiner* — Kimberly Rizkallah
*Assistant Examiner* — Maria Ligai
(74) *Attorney, Agent, or Firm* — Harness, Dickey & Pierce, P.L.C.

(57) ABSTRACT

A substrate structure and method of manufacturing the same are disclosed. The substrate structure may includes a substrate on which a plurality of protrusions are formed on one surface thereof and a plurality of buffer layers formed according to a predetermined pattern and formed spaced apart from each other on the plurality of protrusions.

10 Claims, 4 Drawing Sheets

SUBSTRATE STRUCTURE AND METHOD OF MANUFACTURING THE SAME

CROSS-REFERENCE TO RELATED APPLICATION

This application claims priority under 35 U.S.C. §119 to Korean Patent Application No. 10-2010-0064872, filed on Jul. 6, 2010, in the Korean Intellectual Property Office (KIPO), the disclosure of which is incorporated herein in its entirety by reference.

BACKGROUND

1. Field

Example embodiments relate to substrate structures and methods of manufacturing the same.

2. Description of the Related Art

Nitride-based semiconductors such as GaN are applied to light emitting devices such as blue purple light emitting diodes or laser diodes, and high-speed and high-output electronic devices. Also, white LEDs based on GaN semiconductors and fluorescent materials are widely used. GaN-based LEDs are manufactured mainly on a 2-inch sapphire substrate. However, development of GaN-based LEDS manufactured on a 4-inch sapphire substrate has started and is currently in initial stages.

In order to increase production of LEDs and reduce the unit cost of production, a large-sized substrate is needed. Sapphire substrates are expensive and have low thermal conductivities. For example, when at a high temperature, such as when growing a semiconductor layer over a wide area, the substrate may be bent. Accordingly, it is difficult to maintain uniformity.

Recently, there has been interest in use of silicon substrates in GaN-based light emitting devices. Silicon substrates are cheaper than sapphire substrates and silicon carbide (SiC) substrates and a 12" large-caliber wafer may be used. Also, the cost price may be reduced and production of GaN-based light emitting devices may be increased by using silicon substrates. In addition, as silicon substrates have conductivity, electrodes may be formed on a lower surface of a silicon substrate and thus a manufacturing process thereof may be relatively simple. Moreover, silicon substrates have higher thermal conductivity than sapphire substrates and thus may be bent less at a high temperature for growing a GaN thin film, and thus uniform thin film characteristics may be obtained in a 8-inch substrate.

However, problems regarding high dislocation density, cracks, and optical adsorption occur with the silicon substrate due to great differences in lattice constants and coefficients of thermal expansion between the silicon substrate and a GaN thin film layer. Accordingly, various methods of reducing stress between the silicon substrate and the GaN thin film layer so as to reduce cracks and dislocation density have been suggested.

SUMMARY

Provided are substrate structures that may reduce dislocation density when forming a nitride semiconductor thin film, may suppress generation of cracks, and may be used in light emitting devices and power devices, and methods of manufacturing the same.

Additional aspects will be set forth in part in the description which follows and, in part, will be apparent from the description, or may be learned by practice of the example embodiments.

In accordance with an example embodiment, a substrate structure may include a substrate comprising a first surface having a plurality of protrusions thereon and a plurality of buffer layers on the plurality of protrusions, the plurality of buffer layers being spaced apart from one another.

In accordance with an example embodiment, a method of manufacturing a substrate structure may include forming a buffer layer on a substrate, patterning the buffer layer into a plurality of areas that are spaced apart from one another, each of the plurality of areas including holes exposing parts of the substrate, forming a plurality of cavities in the substrate by performing etching on the parts of the substrate exposed by the holes in the plurality of areas, partially etching a portion of the substrate under the buffer layer via the plurality of cavities, and forming a plurality of semiconductor layers on the plurality of areas.

In accordance with an example embodiment, a substrate structure may include a substrate on which a plurality of protrusions are formed on one surface thereof, and a plurality of buffer layers formed according to a predetermined pattern and formed spaced apart from each other on the plurality of protrusions.

The plurality of buffer layers may be each patterned to have a plurality of holes.

The plurality of protrusions may be each formed in such a way that widths of center parts thereof are narrow and gradually increase toward upper and lower sides.

The plurality of holes may have oval or polygon-shaped cross-sections.

The plurality of buffer layers may be spaced apart from each other by a distance p1, the distance p1 being greater than a diameter p2 of the plurality of holes. p1 and p2 may satisfy the condition below:

$p1 < 5$ um $p2 > 1$ um

The substrate may further include nitride semiconductor layers formed on the buffer layers, the nitride semiconductor layers being grown by using epitaxial lateral overgrowth (ELOG) to allow faster lateral growth than perpendicular growth.

A distance between the plurality of buffer layers may allow the nitride semiconductor layers formed on the plurality of buffer layers not to coalescent together when forming the nitride semiconductor layers by using ELOG.

In accordance with an example embodiment, a method of manufacturing a substrate structure may include forming a buffer layer on a substrate, patterning the buffer layer according to a predetermined pattern, the predetermined pattern comprising a pattern to separate the buffer layer into a plurality of areas that are spaced apart from each other and a pattern to expose parts of the substrate in each of the plurality of areas, forming a plurality of grooves by performing etching on the parts of the substrate exposed in the plurality of areas, partially etching a portion of the substrate that contacts a lower part of the buffer layer via the grooves, and forming a plurality of semiconductor layers on the plurality of areas of the buffer layer.

In the patterning of the buffer layer, the buffer layer may be patterned to have a plurality of holes through the plurality of areas and the buffer layer may be patterned in such a way that the plurality of holes have oval or polygon-shaped cross-sections.

The buffer layer may be patterned in such a way that a distance p1 between the plurality of areas is greater than a diameter p2 of the plurality of holes.

In the forming of the semiconductor layers, the semiconductor layers may be formed by using epitaxial lateral overgrowth (ELOG) to allow faster lateral growth than perpendicular growth and the degree of ELOG may be adjusted so that the semiconductor layers formed on the plurality of areas do not coalesce together.

BRIEF DESCRIPTION OF THE DRAWINGS

These and/or other aspects will become apparent and more readily appreciated from the following description of the example embodiments, taken in conjunction with the accompanying drawings of which.

DETAILED DESCRIPTION

Figure 1:
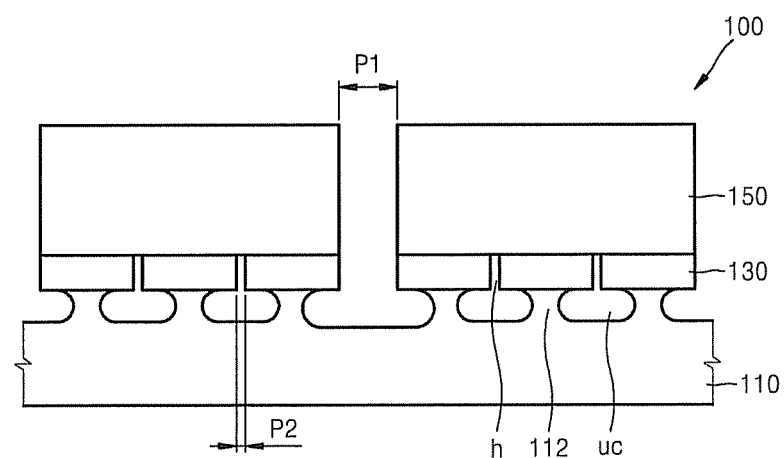
FIG. 1 is a cross-sectional view of a substrate structure, according to an example embodiment of the present invention.

Example embodiments will now be described more fully with reference to the accompanying drawings, in which example embodiments are shown. The invention may, however, be embodied in different forms and should not be construed as limited to example embodiments set forth herein. Rather, example embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Hereinafter, example embodiments of the present invention will be described in more detail with reference to the accompanying drawings. In the drawings, like reference numerals denote like elements and sizes of each element may be exaggerated for clarity and convenience of description.

Figure 2:
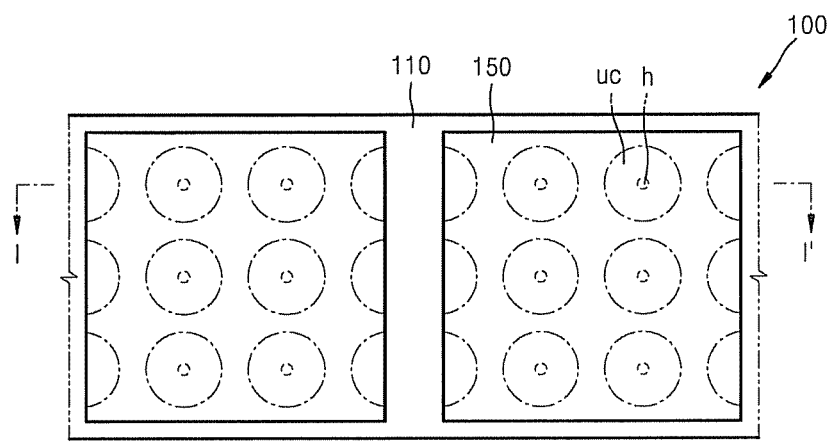
FIG. 2 is a plan view of the substrate structure of FIG. 1.
Figure 3:
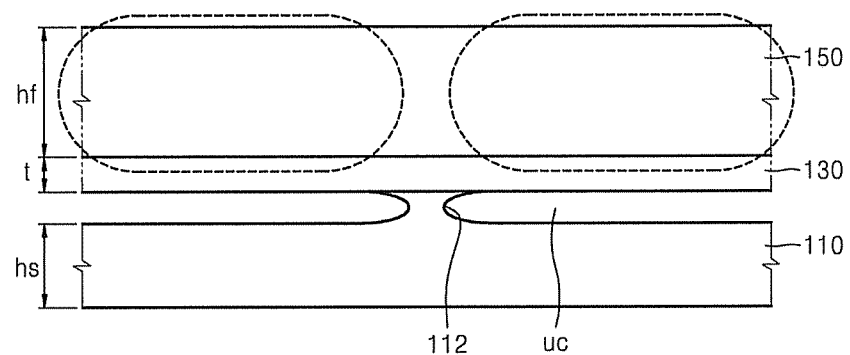
FIG. 3 is a partial expanded view of the substrate structure of FIG. 1 for explaining that relatively excellent thin film quality may be realized in the substrate structure of FIG. 1.

FIG. 1 is a cross-sectional view of a substrate structure 100, according to an example embodiment of the present invention, FIG. 2 is a plan view of the substrate structure 100 of FIG. 1, and FIG. 3 is a partial expanded view of the substrate structure 100 for explaining that relatively excellent thin film quality may be realized in the substrate structure 100 of FIG. 1. In the figures, FIG. 1 is a cross-sectional view of the substrate structure 100 and corresponds to the section line 1-1' illustrated in FIG. 2.

Referring to FIG. 1, the substrate structure 100 includes a substrate 110 having a surface upon which a plurality of protrusions 112 is formed. In this example embodiment a plurality of buffer layers 130 is formed on the plurality of protrusions 112. The plurality of buffer layers 130 may be formed spaced apart from each other on the plurality of protrusions 112 and may be formed according to a predetermined pattern. Semiconductor layers 150 may be further formed on the plurality of buffer layers 130.

The plurality of protrusions 112 may be formed by partially etching the substrate 110. As shown in FIGS. 1 and 3, the protrusions 112 may have an hourglass shape. In other words, as shown in FIGS. 1, 2, and 3, the protrusions 112 may be formed in such a way that widths of center parts thereof are narrow and gradually increase toward upper and lower sides. The substrate 110 may be a silicon (Si) substrate and may include a Si (111), Si (110), or Si (100). Also, the substrate 110 may be formed of GaN, sapphire, SiC, $LiGaO_2$, $ZrB_2$, ZnO, or $(Mn, Zn)FeO_4$.

The plurality of buffer layer 130 are spaced apart from each other on a plane parallel to the substrate 110 and each may be patterned to have a plurality of holes h. The plurality of holes h are prepared to make undercut areas uc between the plurality of protrusions 112. The undercut areas uc are prepared to form areas of the semiconductor layers 150 having a relatively free-standing characteristic. That is, some parts of the buffer layers 130 corresponding to the undercut areas uc do not contact the substrate 110 and areas of the semiconductor layers 150 formed on these parts of the buffer layers 130 have a relatively free-standing characteristic. A diameter p2 of the holes h may be determined according to a size of the undercut areas uc and may be, for example, greater than about 1 μm. Also, the diameter p2 of the holes h may be determined to be such that semiconductor materials grown around the holes h may coalesce together by using epitaxial lateral overgrowth (ELOG) so that the semiconductor layers 150 may cover the holes h when the semiconductor layers 150 are grown on the buffer layers 130. The holes h are illustrated as having circular cross-sections in FIG. 2; however, the present invention is not limited thereto. The cross-sections of the holes h may be in the form of several shapes, for example, an oval or a polygon.

As will be described later, the buffer layers 130 are each patterned to have the plurality of holes h in order to minimize dislocations that may occur due to ELOG when the semiconductor layers 150 are formed on the buffer layers 130.

Also, a distance p1 between the plurality of buffer layers 130 may be larger than the diameter p2 of the plurality of holes h. More specifically, when the semiconductor layers 150 are grown on the buffer layers 130 by using ELOG, the distance p1 may be such that the semiconductor layers 150 formed on adjacent buffer layers 130 may not coalesce together and may be separated from each other. Each of the semiconductor layers 150 separated by the distance p1 may become a unit of a chip that is used in a light emitting device such as an LED or a laser diode (LD) or a power device and may have an appropriate size in consideration of overall density of a chip. The distance p1 may be less than about 5 μm.

The buffer layers 130 may each be formed as a single layer formed of AlN, SiC, Al2O3, AlGaN, AlInGaN, AlInBGaN, AlBGaN, GaN, or XY, or a multi-layer formed of combinations thereof. Here, X is Ti, Cr, Zr, Hf, Nb, or Ta and Y is N, B, or $B_2$.

The semiconductor layers 150 may be formed of a GaN-based semiconductor material and may entirely cover all the holes h by using ELOG.

That a high quality semiconductor thin film is realized in the substrate structure 100 will be described with reference to FIG. 3. In general, when a thin film is formed on a substrate, stresses $\epsilon_s$ and $\epsilon_f$ are distributed in the substrate and the thin film are as follows.

$$\epsilon_s = -\epsilon_m \frac{h_f}{h_s + h_f},$$

$$\epsilon_f = \epsilon_m \frac{h_s}{h_s + h_f}$$

[Equation 1]

$h_s$ and $h_f$ are thicknesses of the substrate and the thin film, respectively, and $\epsilon_m$ is a stress constant representing a stress due to lattice mismatch. The stress constant, for example, may be based on lattice constants of the substrate and the film.

According to Equation 1, between the thin film and the substrate, stress is greater in the thinner of the two. In consideration of general thicknesses of the substrate and the thin film being few hundreds μm and few μm, respectively, stress may be localized in the thin film. However, as described above, the undercut areas uc are formed so that the buffer layers 130 are supported by the protrusions 112 of the substrate 110. Also, the parts of the buffer layers 130 corresponding to the undercut areas uc do not contact the substrate 110, and thus areas of the semiconductor layers 150 thereon, as indicated by dotted lines, become free-standing areas. When Equation 1 is applied with respect to the free-standing areas, a thickness t of the buffer layers 130 is applied instead of the thickness $h_s$ of the substrate 110. Consequently, stress is localized in the buffer layers 130 having a relatively thin thickness. The semiconductor layers 150 formed on the buffer layers 130 may have low dislocation density and cracks may be less generated therein due to the reduced stress in the semiconductor layers 150.

According to the current example embodiment, the plurality of buffer layers 130 are spaced apart from each other and thereby, the semiconductor layers 150 are spaced apart from each other into chip units so that the thin narrow parts of the protrusions 112 may be prevented from being damaged while manufacturing. The thin narrow parts of the protrusions 112 may be broken by stress occurring when the grown semiconductor layers 150 are cooled down to room temperature from a high growing temperature. In order to prevent this, the structure of the current example embodiment is provided, in which stress occurring during cooling may be reduced. When the semiconductor layers 150 are formed to be separated into a chip size as in the present example embodiment, instead of being formed to have a large size of diameter 2" or greater, the stress occurring between the substrate 110 and the semiconductor layers 150 may be reduced and the center narrow parts of the protrusions 112 may be prevented from being damaged.

The substrate structure 100 according to the current example embodiment of the present invention may be applied to various electronic devices and may be used in a power device, for example, a GaN-based light emitting device or a high electron mobility transistor (HEMT) device.

Figure 4:
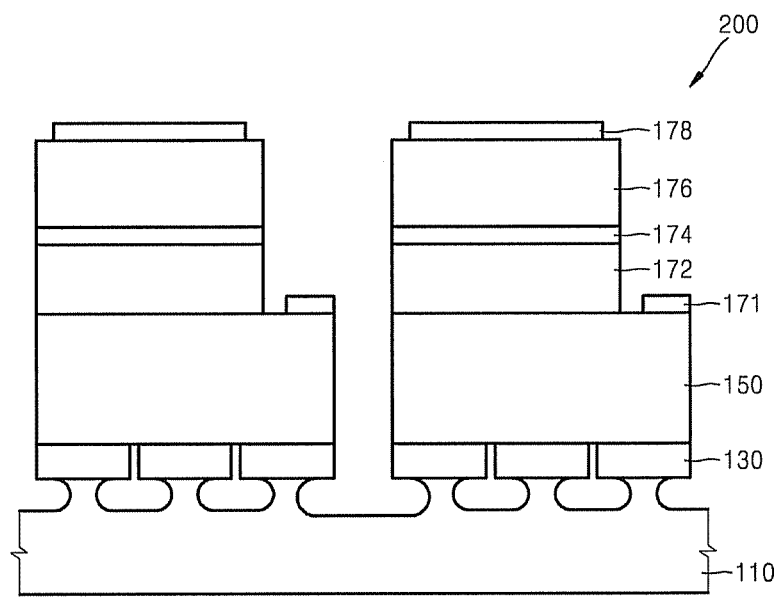
FIG. 4 is a cross-sectional view of a light emitting device formed by using the substrate structure of FIG. 1.

FIG. 4 is a cross-sectional view of a light emitting device 200 formed by using the substrate structure 100 of FIG. 1. Referring to FIG. 4, a first electrode 171 is formed on one area of the semiconductor layers 150, and a first type semiconductor layer 172, an active layer 174, and a second type semiconductor layer 176 are sequentially formed on another area of the semiconductor layers 150. A second electrode 178 is formed on the second type semiconductor layer 176. The first type semiconductor layer 172 and the second type semiconductor layer 176 may be formed of an n-type semiconductor material and a p-type semiconductor material, respectively, or vice versa. The active layer 174 may be formed to have a multi-quantum-well structure. In FIG. 4, each layer is a single layer. However, the present invention is not limited thereto and each layer may be a multi-layer.

FIGS. 5A through 5E are views for explaining a method of manufacturing the substrate structure 100, according to an example embodiment of the present invention.

Figure 5A:
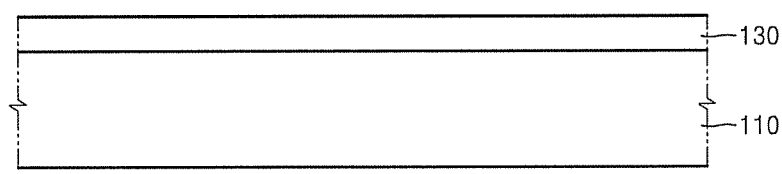
FIGS. 5A through 5E are views for explaining a method of manufacturing the substrate structure of FIG. 1, according to an example embodiment of the present invention.

Referring to FIG. 5A, the buffer layer 130 is formed on the substrate 110. The substrate 110 may be formed of Si, GaN, sapphire, SiC, LiGaO2, ZrB2, ZnO, or (Mn,Zn)FeO4. The buffer layer 130 may each be a single layer formed of AlN, SiC, Al2O3, AlGaN, AlInGaN, AlInBGaN, AlBGaN, GaN, or XY, or a multi-layer formed of combinations thereof. Here, X is Ti, Cr, Zr, Hf, Nb, or Ta and Y is N, B, or $B_2$.

Figure 5B:
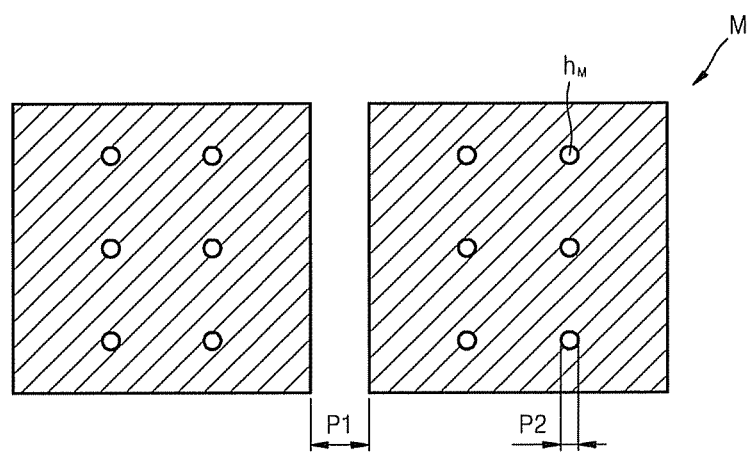
Figure 5C:
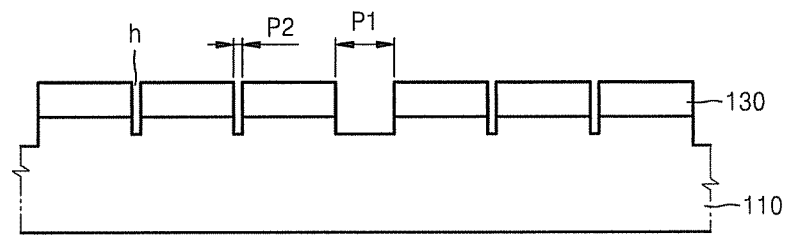

In FIGS. 5B and 5C, the buffer layer 130 is patterned according to a predetermined pattern. Here, although not illustrated, a semiconductor layer, for example, a GaN thin film layer, may be further formed on the buffer layer 130 and then a patterning process may be performed to pattern the GaN thin film layer together with the buffer layer 130.

The predetermined pattern may include a pattern to separate the buffer layer 130 into a plurality of areas that are spaced apart from each other and a pattern to expose parts of the substrate 110 in each of the plurality of areas. For example, a mask M illustrated in FIG. 5B may be used, wherein the mask M is divided into a plurality of parts through which a plurality of holes $h_M$ are each formed. The holes $h_M$ are illustrated as having a circular shape. However, the present invention is not limited thereto and the holes $h_M$ may be in different forms, for example, an oval or a polygon. The plurality of parts of the mask are spaced apart from each other by the distance p1 and the holes $h_M$ have the diameter p2. In this regard, the buffer layer 130 is divided into a plurality of areas spaced apart from each other by the distance p1 and the plurality of holes h are formed through each of the plurality of areas. The substrate 110 is exposed by the holes h formed through the buffer layer 130 and the exposed substrate 110 is etched so as to form a plurality of grooves (cavities) on the substrate 110 as illustrated in FIG. 5C.

Figure 5D:
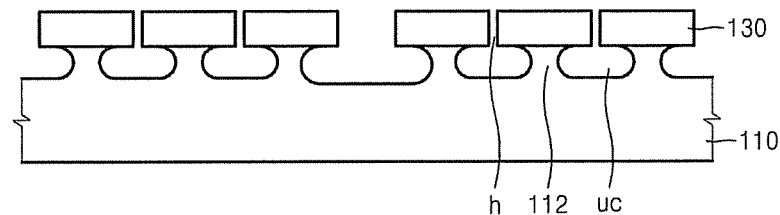

As illustrated in FIG. 5D, some parts of the substrate 110 contacting a lower part of the buffer layer 130 are etched via the grooves (cavities) so as to form the undercut areas uc. The form of the undercut areas uc is based on the characteristic of a crystal face. When wet etching or dry/wet etching is performed on the grooves (cavities) formed on the substrate 110, sides of the substrate 110 may be etched more according to the characteristic of a crystal face. Accordingly, the protrusions 112 that support the buffer layer 130 are formed and most parts of the buffer layer 130 do not contact the substrate 110 and have a free-standing characteristic.

Figure 5E:
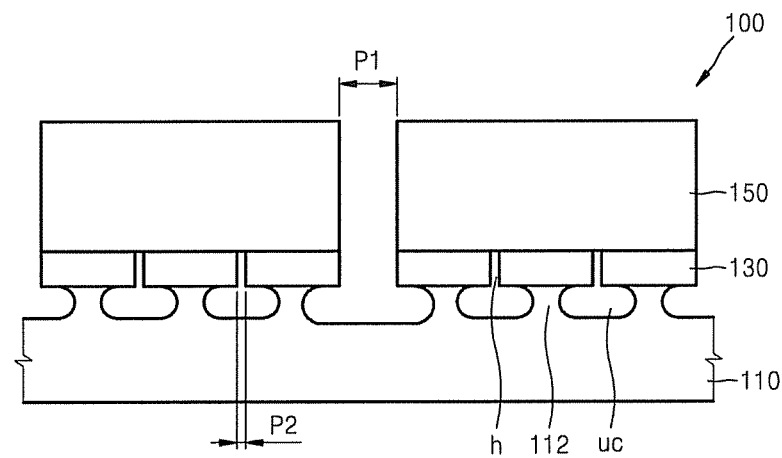

Then, as illustrated in FIG. 5E, the semiconductor layers 150 are each formed on the plurality of areas of the buffer layer 130. The semiconductor layers 150 may be formed of, for example, a GaN-based nitride semiconductor material grown by using metal organic chemical vapor deposition (MOCVD). Also, ELOG, which allows for faster lateral growth than perpendicular growth, may be used when forming the semiconductor layers 150. Accordingly, semiconductor materials grown around the holes h of the buffer layer 130 may coalesce together and thus the holes h of the buffer layer 130 are covered by the semiconductor layers 150. Here, the plurality of holes h are each formed having a round shape so that dislocation, which may occur commonly when using ELOG, may be reduced. That is, dislocation frequently occurs at a position where coalescence occurs in ELOG. In the current example embodiment, the position where coalescence occurs is in a dot form and thus dislocation due to ELOG may be reduced. If the pattern of the buffer layer 130 has, for example, a line form in which the plurality of holes h are connected to each other, dislocation will occur in a line form throughout a wide area. However, the buffer layer 130 is patterned to have the plurality of holes h spaced apart from each other and thus defects may be less generated.

Also, the degree of ELOG may be adjusted so that the semiconductor layers 150, formed on the buffer layer 130, do not coalesce together. Accordingly, the semiconductor layers 150 may be separated from each other. Thus, stress of the protrusions 112, which support the buffer layer 130, may be reduced and the center narrow parts of the protrusions 112 may be prevented from being damaged.

As described above, according to example embodiments of the present invention, a substrate structure that may reduce dislocation density when forming a nitride semiconductor thin film and suppress generation of cracks, and a method of manufacturing the substrate structure are provided.

Also, the buffer layer may be patterned for the semiconductor thin film to be grown as separated chip units so that defects that may occur during manufacturing may be reduced.

The substrate structure may be applied to a light emitting device such as an LED or an LD, or a power device.

It should be understood that the example embodiments described herein should be considered in a descriptive sense only and not for purposes of limitation. Descriptions of features or aspects within each example embodiment should typically be considered as available for other similar features or aspects in other embodiments.

What is claimed is:

1. A substrate structure, comprising:
   a substrate including a first surface having a plurality of protrusions thereon; and
   a plurality of buffer layers on the plurality of protrusions, the plurality of buffer layers being spaced apart from one another, the plurality of buffer layers each having a plurality of holes extending through opposing surfaces of the buffer layer; and
   at least one nitride semiconductor layer on some of the plurality of buffer layers and covering some of the plurality of holes.

2. The substrate structure of claim 1, wherein at least one of the plurality of protrusions has a cross-section with an hour-glass shape.

3. The substrate structure of claim 1, wherein the plurality of holes have one of a circular, an oval, and a polygon-shaped cross-section.

4. The substrate structure of claim 1, wherein the plurality of buffer layers are spaced apart from each other by a distance p1, the distance p1 being greater than a diameter p2 of the plurality of holes.

5. The substrate structure of claim 4, wherein p1 is less than 5 μm and p2 is greater than 1 μm.

6. The substrate structure of claim 1, wherein a distance between the plurality of buffer layers allows the nitride semiconductor layers on the plurality of buffer layers not to coalescent together when forming the nitride semiconductor layers using epitaxial lateral overgrowth (ELOG).

7. The substrate structure of claim 1, wherein the substrate includes one of Si, GaN, sapphire, SiC, $LiGaO_2$, $ZrB_2$, ZnO, and $(Mn,Zn)FeO4$.

8. The substrate structure of claim 1, wherein the plurality of buffer layers are one of a single layer and a multi-layer, the single layer including one of AlN, SiC, $Al_2O_3$, AlGaN, AlInGaN, AlInBGaN, AlBGaN, GaN, and XY, and the multi-layer including combinations thereof, and X is one of Ti, Cr, Zr, Hf, Nb, and Ta and Y is one of N, B, and $B_2$.

9. The substrate structure of claim 1, wherein the plurality of protrusions are each separated from an adjacent protrusion by an undercut area directly under one of the plurality of holes or directly under the spaced apart buffer layers.

10. The substrate structure of claim 9, wherein adjacent protrusions separated from each other by the undercut area directly under one of the plurality of holes have a cross-section with an hour-glass shape.

* * * * *